United States Patent
Paul

(10) Patent No.: US 9,606,208 B2
(45) Date of Patent: Mar. 28, 2017

(54) MAGNETIC RESONANCE SYSTEM, AND DEVICE AND METHOD FOR CONTROL THEREOF

(71) Applicant: Dominik Paul, Bubenreuth (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 710 days.

(21) Appl. No.: 14/012,021

(22) Filed: Aug. 28, 2013

(65) Prior Publication Data
US 2014/0062478 A1   Mar. 6, 2014

(30) Foreign Application Priority Data

Aug. 28, 2012 (DE) .................. 10 2012 215 255

(51) Int. Cl.
| | |
|---|---|
| *G01R 33/54* | (2006.01) |
| *G01R 33/561* | (2006.01) |

(52) U.S. Cl.
CPC ....... *G01R 33/543* (2013.01); *G01R 33/5612* (2013.01)

(58) Field of Classification Search
CPC .... G03G 33/543; G01R 33/54–33/546; G01R 33/288
See application file for complete search history.

(56) References Cited

U.S. PATENT DOCUMENTS

| | | | |
|---|---|---|---|
| 2006/0017437 A1* | 1/2006 | Vu | G01R 33/583 |
| | | | 324/309 |
| 2008/0221430 A1 | 9/2008 | Ochi et al. | |
| 2008/0284439 A1* | 11/2008 | Xu | A61B 5/055 |
| | | | 324/322 |
| 2009/0256570 A1 | 10/2009 | Zelinski et al. | |
| 2010/0268062 A1* | 10/2010 | Edelman | G01R 33/5635 |
| | | | 600/410 |
| 2011/0101980 A1 | 5/2011 | Ohiwa et al. | |

(Continued)

FOREIGN PATENT DOCUMENTS

WO   2013/024449   2/2013

OTHER PUBLICATIONS

Basic of MRI, Chapter 6, Imaging Principles.*

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method for controlling a magnetic resonance system with multiple radio-frequency transmission channels, via which parallel RF pulse trains are emitted in operation, as well as a magnetic resonance system and a pulse optimization device therefor, RF pulse trains respectively include at least one radio-frequency pulse. The RF pulse trains are initially determined so that a minimum $B_1$ field maximum value is not exceeded by the radio-frequency pulse. In an examination subject-specific adjustment step, a current component-dependent $B_1$ field maximum value is then determined, and the radio-frequency pulse is temporally shortened, with its amplitude being increased dependent on the current component-dependent $B_1$ field maximum value.

20 Claims, 4 Drawing Sheets

(56) References Cited

U.S. PATENT DOCUMENTS

| | | | |
|---|---|---|---|
| 2012/0019247 A1 | 1/2012 | Boernert et al. | |
| 2012/0032676 A1* | 2/2012 | Dannels | G01R 33/246 |
| | | | 324/309 |
| 2012/0161766 A1* | 6/2012 | Harvey | G01R 33/5612 |
| | | | 324/309 |
| 2012/0197106 A1 | 8/2012 | Cloos et al. | |
| 2013/0285660 A1* | 10/2013 | Ritter | G01R 33/3607 |
| | | | 324/314 |
| 2013/0342200 A1* | 12/2013 | Ugurbil | G01R 33/4835 |
| | | | 324/307 |
| 2014/0091795 A1* | 4/2014 | Grodzki | G01R 33/288 |
| | | | 324/309 |
| 2015/0108984 A1* | 4/2015 | Pfeuffer | G01R 33/307 |
| | | | 324/322 |
| 2015/0241539 A1* | 8/2015 | Kaneko | A61B 5/055 |
| | | | 324/307 |
| 2015/0260808 A1* | 9/2015 | Katscher | G01R 33/4833 |
| | | | 324/309 |
| 2015/0268321 A1* | 9/2015 | Zhai | G01R 33/288 |
| | | | 324/309 |
| 2015/0276898 A1* | 10/2015 | Findeklee | G01R 33/34046 |
| | | | 324/309 |
| 2015/0285877 A1* | 10/2015 | Pfeuffer | G01R 33/34092 |
| | | | 324/309 |
| 2015/0293187 A1* | 10/2015 | Arai | G01R 33/36 |
| | | | 324/309 |
| 2015/0301131 A1* | 10/2015 | Hardy | G01R 33/4833 |
| | | | 324/309 |

OTHER PUBLICATIONS

Tang, L. Studies of RF Shimming Techniques with Minimization of RF Power Deposition and Their Associated Temperature changes.*

Mao, W. Exploring the Limits of RF Shimming for High-Field MRI of the Human Head.*

Grissom et al., "Spatial Domain Method for the Design of RF Pulses in Multicoil Parallel Excitation", in: Magnetic Resonance in Medicine (2006) vol. 56, pp. 620-629.

Graesslin I.; "Parallel transmission a Comprehensive RF Safety Concept" Piers Proceedings, Cambidge USA Jul. 2-6, 2008; pp. 698-700.

Lee et al. "Local SAR in Parallel Transmission Pulse Design"; Magnetic Resonsnance in Medicine; vol. 67; (2012) pp. 1566-1578.

Boulant et al.; "Method for monitoring safety in parallel transmission systems based on channel-dependent average powers"; Proc. ISMRM; (2011) vol. 19; p. 3830.

Dieter Ritter, U.S. Appl. No. 13/872,101, filed Apr. 27, 2013, Controlling a Magnetic Resonance System, pp. 1-67.

Graesslin et al.. "Comprehensive RF Safety Concept for Parallel Transmission Systems" Proc. Intl. Soc. Mag. Reson. Med. vol. 16 (2008.

* cited by examiner

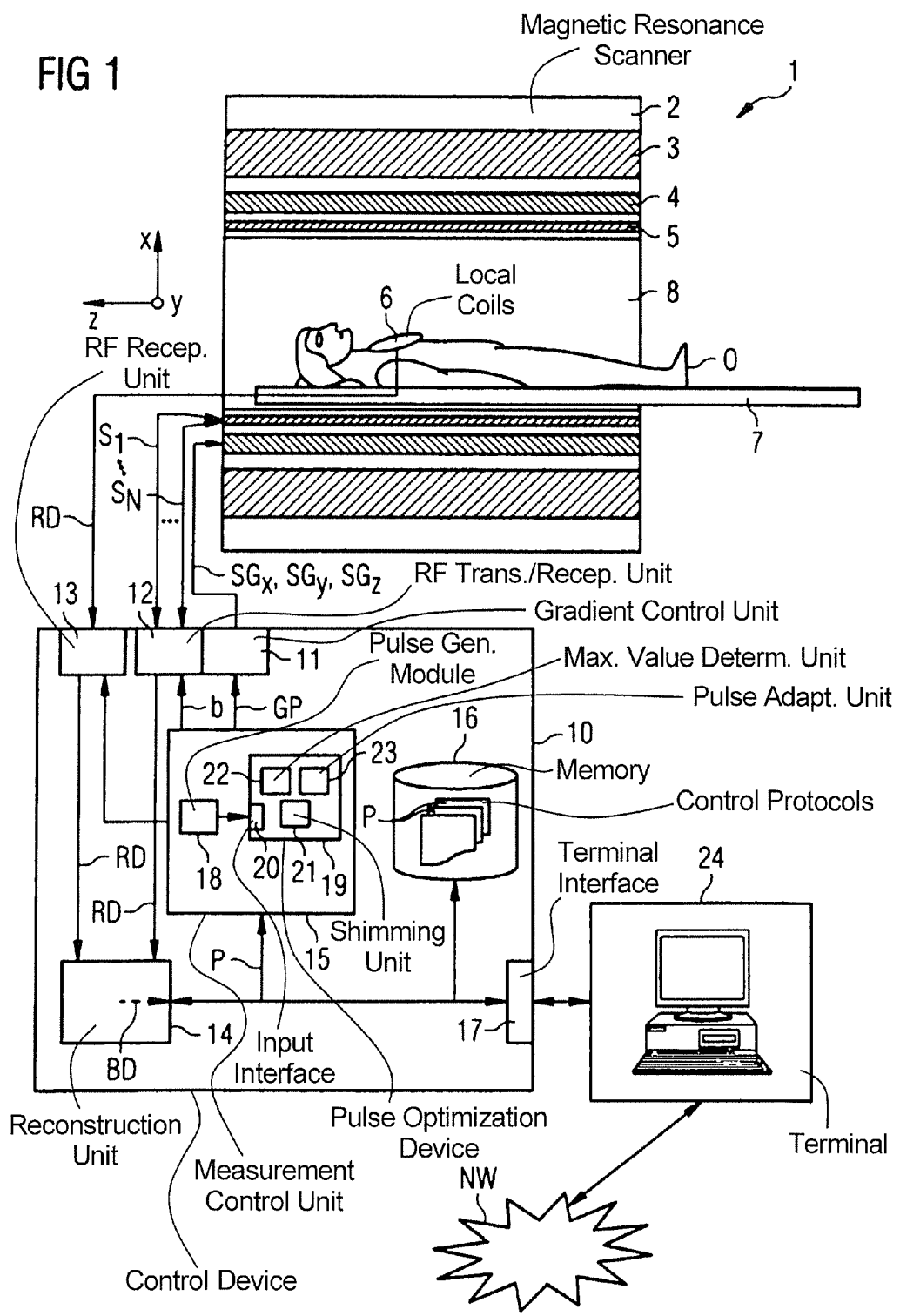

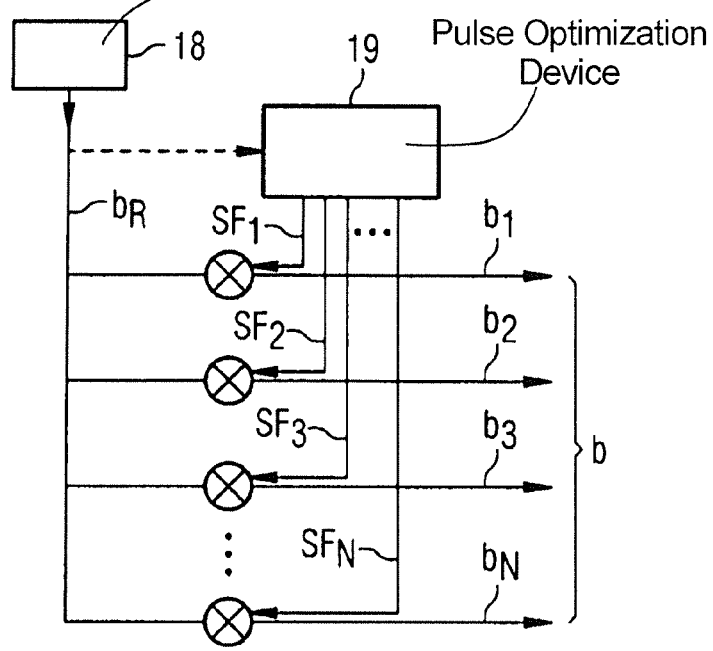
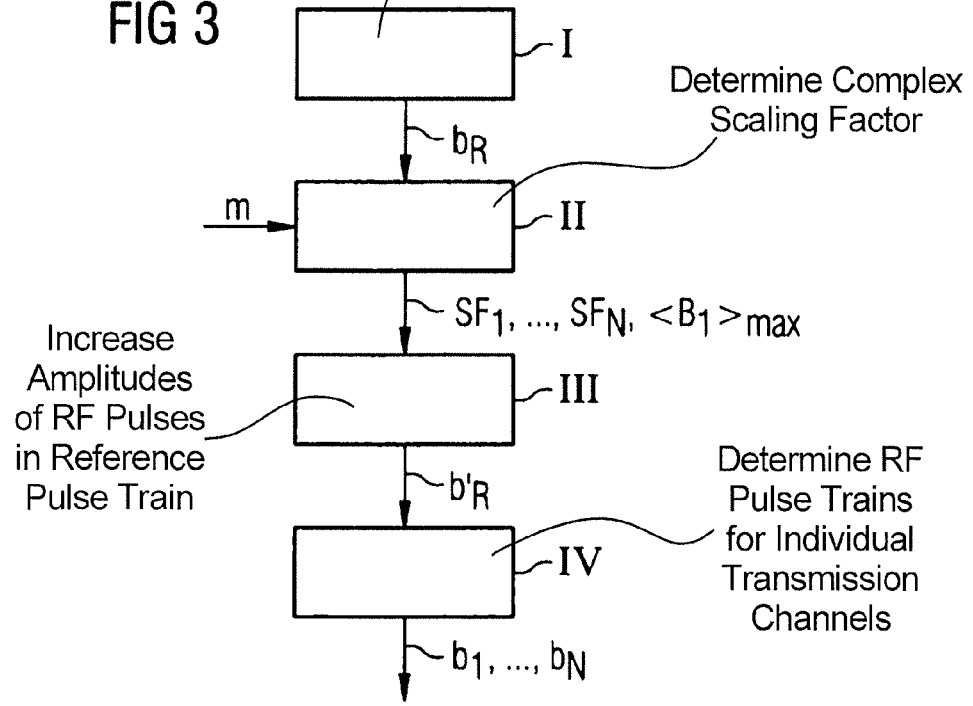

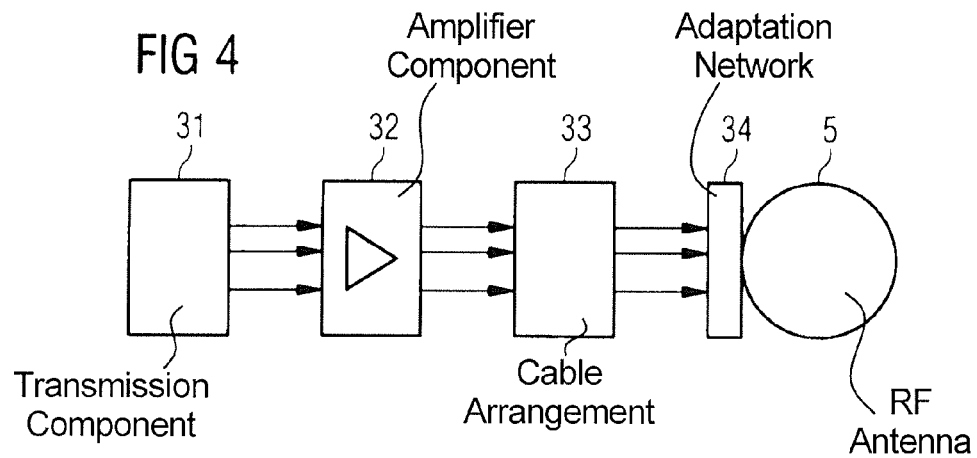
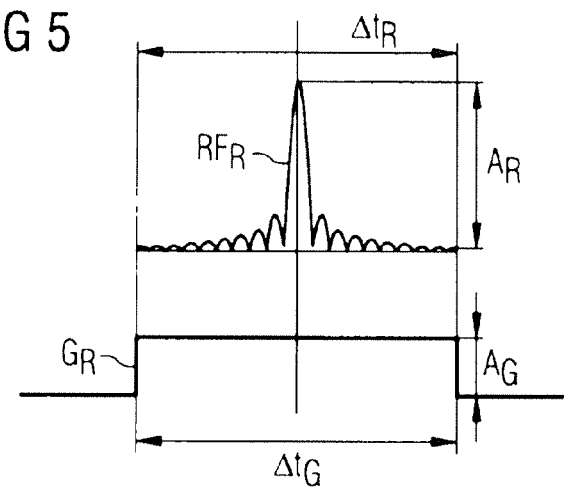
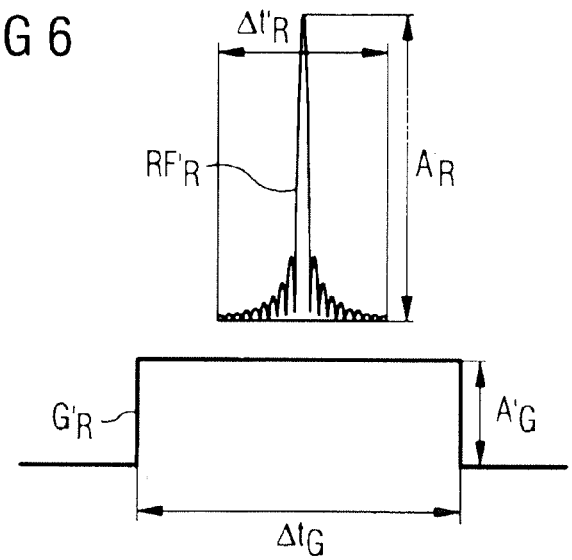

MAGNETIC RESONANCE SYSTEM, AND DEVICE AND METHOD FOR CONTROL THEREOF

BACKGROUND OF THE INVENTION

Field of the Invention

The present invention concerns a method for controlling a magnetic resonance system that has multiple radio-frequency transmission channels via which, in operation, RF pulse trains (radio-frequency pulse trains) are emitted in parallel, each RF pulse train including at least one radio-frequency pulse. The RF pulse trains are initially determined so that a minimum B1 field maximum value is not exceeded by the radio-frequency pulse in the emission of the RF pulse trains. Moreover, the invention concerns a pulse optimization device in order to determine transmission scaling factors for the individual radio-frequency transmission channels within the framework of such an RF pulse optimization method, as well as a magnetic resonance system with such a pulse optimization device.

Description of the Prior Art

In a magnetic resonance system or magnetic resonance tomography system, the subject to be examined is typically exposed by means of a basic field magnet system, subject to a relatively high basic magnetic field (also designated as a "$B_0$ field") of 3 or 7 Tesla, for example, which aligns nuclear spins in the subject with the direction of the basic magnetic field. By means of a gradient system, a magnetic field gradient is additionally applied. By means a radio-frequency transmission system, radio-frequency excitation signals (RF signals) are then emitted by suitable antenna devices, in order to cause the nuclear spins of specific atoms in the subject to be excited to resonance. The radio-frequency field (also designated as a "$B_1$ field") has a defined flip angle relative to the magnetic field lines of the basic magnetic field that causes the nuclear spins to be deflected or "flipped" by the flip angle, with a spatial coding produced by the gradient field. This radio-frequency excitation or the resulting flip angle distribution is also designated in the following as a nuclear magnetization, or "magnetization" for short. The correlation between the magnetization m and the $B_1$ field radiated over a time duration T is:

$$m \approx 2\pi\gamma \cdot \int_{t=0}^{T} B_1(t)dt \quad (1)$$

wherein $\gamma$ is the gyromagnetic ratio, t is the time variable, and $B_1(t)$ is the temporally variable magnetic field strength of the $B_1$ field. Upon relaxation of the nuclear spins, radio-frequency signals (known as magnetic resonance signals) are radiated that are received by means of suitable reception antennas and then are processed further. Finally, the desired image data can be reconstructed from the raw data that is acquired in such a manner. The emission of the radio-frequency signals for nuclear spin magnetization usually takes place by means of a radiator known as a "whole-body coil" (also called a "body coil"), or sometimes with local coils placed on the patient or subject. A typical design of a whole-body coil is a cage antenna (birdcage antenna) that has multiple transmission rods that are arranged parallel to the longitudinal axis of the patient space in the system (scanner) and distributed around the patient space, in which a patient is located in the examination. The antenna rods are capacitively connected with one another in an annular form at their ends.

It has been typical to operate whole-body antennas in a "CP mode" (circularly polarized mode) or an "EP mode" (elliptically polarized mode). For this purpose, a single temporal RF signal is provided to all components of the transmission antenna, for example all transmission rods of a birdcage antenna. The transfer of the pulses with identical amplitude to the individual components typically takes place with a phase offset exhibiting a displacement or shift adapted to the geometry of the transmission coil. For example, for a birdcage antenna with 16 rods, the rods are respectively controlled with the same RF magnitude signal, offset with a 22.5° phase shift. The result is then a radio-frequency field that is circularly polarized in the x/y-plane, i.e. orthogonal to the longitudinal axis of the birdcage antenna running in the z-direction.

More modern systems already have multiple independent radio-frequency transmission channels via which different radio-frequency pulse trains can be emitted in parallel in operation. For example, in such systems the individual rods in a birdcage antenna are separately charged with radio-frequency pulses that are independent of one another. The emitted RF field then arises by a superposition of the signals emitted by the individual transmission channels.

It is thereby possible to precisely, individually establish the amplitudes and phases of the individual RF pulses in order to achieve a desired radio-frequency field pattern that is spatially shaped in a specific manner.

Moreover, the possibility exists to implement what is known as "RF shimming" or "$B_1$ shimming". In this method, only a single reference pulse train is initially provided, which is modified individually in amplitude and phase for every single transmission channel, such that ultimately a particularly homogenous $B_1$ field is emitted in a defined volume under consideration. This $B_1$ shimming takes place in a special adjustment step in which—as will be explained below—a suitable complex scaling factor is determined for each of the transmission channels, with which scaling factor the reference pulse train or its RF pulses in that channel are scaled.

In each, however, a complete pulse sequence is initially developed (designed) before the start of a measurement, and then, possibly after a $B_1$ shimming, the measurement (data acquisition) is implemented wholly automatically using the predetermined pulse sequence, according to the requirements of a measurement protocol.

A problem with this conventional procedure is that, for technical reasons related to the apparatus, the components located in the transmission chain of the magnetic resonance system, such as RF amplifiers, cables, measurement apparatuses, adaptation networks, etc.—must be protected from overvoltages. Therefore, upon emission of a pulse train it is initially monitored as to its voltage compatibility with regard to the relevant components, and the voltage of the pulse train is thus limited. With the emergence of systems with two or more independent transmission channels, this voltage limitation (also generally designated as a $B_1$ limit) can be limited differently by the phase relationship of the various channels. Since the RF pulses at the various channels not only have different pulse levels but also can be phase shifted counter to one another, voltage differences that are higher than the maximum amplitude of the individual RF pulses of the pulse trains can occur between these channels. This means that the $B_1$ limit at the point in time of the adjustment of the protocol, or at the point in time of the design of the pulse sequence, is not yet known. However, a minimum duration of the RF pulses results from this limit due to the other predetermined boundary conditions for the creation of the pulse sequence (such as flip angle, bandwidth, pulse shape etc. of the RF pulses). The timing (the relative temporal arrangement of the pulses) of the entire pulse sequence is therefore hard-set and normally can no longer be changed without affecting important time parameters, for example the echo time (which is responsible for the contrast of the image data, among other things). The $B_1$ limit in the design of the radio-frequency pulses thus does not coincide with the $B_1$ limit calculated later during the adjustment or in the monitoring step, which can lead to inconsistencies that cause the pulse sequence not to be emitted as originally planned. This can lead to a reduced image quality.

In order to circumvent this problem, for example, the $B_1$ limit could always be set to an absolute minimum $B_1$ field maximum value. This would mean that, in the design of the pulse sequences, it is already ensured that the $B_1$ limit would not be underrun even in the worst case. The timing within the pulse sequence then must accordingly always be selected so that the maximum necessary pulse length is assumed in order to achieve the desired flip angle with the allowed maximum amplitude of the radio-frequency pulses. However, if the pulse is more significantly extended than is actually necessary in order to maintain a defined amplitude, the bandwidth of the pulse is automatically strongly reduced in comparison to the optimal case. A reduced bandwidth of the radio-frequency pulses in turn increases the probability of artifacts due to chemical shift, or a greater susceptibility to artifacts of the $B_0$ field.

SUMMARY OF THE INVENTION

An object of the present invention is to provide an alternative control method as well as a suitable pulse optimization device with which the aforementioned effects can be reduced in a simple manner even given systems with two or more independent excitation channels.

In the method according to the invention for controlling a magnetic resonance system of the type described above that has multiple radio-frequency transmission channels that can in principle be controlled independently, via which transmission channels the parallel RF pulse trains (that each include at least one radio-frequency pulse) are emitted in operation. As is typical, the RF pulse trains are initially determined so that a minimum $B_1$ field maximum value is not exceeded in the emission of the respective RF pulse trains by the radio-frequency pulses. As before, the worst case scenario is assumed and the minimum $B_1$ field maximum value is selected so that the amplitude of the individual radio-frequency pulses is sufficiently low so that the component protection conditions are achieved in every case. For this purpose, the RF pulse is accordingly temporally extended so that the entire timing of the pulse sequence is aligned so that a longer radio-frequency pulse can be used. A "pulse sequence" within the scope of the invention is a radio-frequency pulse train including the associated gradient pulses, as well as the connected readout window for the acquisition of the magnetic resonance signals.

Some pulse sequences—in particular GRE sequences (gradient echo sequences), for example—have only one RF pulse per RF pulse train. In many cases, an RF pulse train includes multiple radio-frequency pulses (for example an excitation pulse) in order to initially excite spins in a defined, predetermined slice, and then to obtain at defined time intervals one or more refocusing pulses which provide for a refocusing of the spins in the initially excited slice, and thereupon to obtain echo signals at defined points in time. In this case, the method according to the invention is implemented for all of these radio-frequency pulses of the RF pulse train, meaning that for each radio-frequency pulse, care is taken that a minimum $B_1$ field maximum value is not exceeded by that radio-frequency pulse, and the sequence timing is accordingly adapted to the lengths of the radio-frequency pulses that are required for this. In the following, it is assumed that the method according to the invention is implemented with multiple RF pulses, but this does not preclude the method from being implemented with only at one RF pulse of a longer pulse sequence with multiple RF pulses per RF pulse train, or at a pulse sequence with only one RF pulse per RF pulse train.

According to the invention, in an adjustment step that is specific to the examination subject, a current, component-dependent $B_1$ field maximum value is then determined. The term "specific to the examination subject" as used herein means the examination subject (for example, the patient) is located within the apparatus during the adjustment, and accordingly the adjustment takes place with respect to (dependent on) the individual examination subject. As used herein, a "current, component-dependent $B_1$ field maximum value" (also called only "$B_1$ field maximum value" in the following) means a $B_1$ field maximum value that is due to the fact that the transmission components (TX components) in the RF transmission path of the magnetic resonance system are limited with regard to (for example) a maximum allowable voltage, in particular also a difference voltage between adjustment channels. Above this voltage, an impairment of the function or even damage to the respective TX component could occur. Inasmuch, the aforementioned "minimum $B_1$ field maximum value" is also a component-dependent $B_1$ field maximum value since it is also due to the transmission components of the magnetic resonance system. In contrast to the current component-dependent $B_1$ field maximum value, however, this is the "worst case" value that must be maintained in the most disadvantageous case, in contrast to which the current component-dependent $B_1$ field maximum value is established individually in the adjustment method for the respective examination subject or patient, possibly even for a determined region of interest (ROI). A method to determine a current component-dependent $B_1$ field maximum value is explained further later.

Furthermore, with the scope of the invention the radio-frequency pulses of the RF pulse trains are finally temporally shortened, wherein their amplitudes are increased (i.e. suitably scaled) under consideration of the current component-dependent $B_1$ field maximum value. The shortening and increase of the pulses preferably take place proportionally to one another. Within the scope of the invention, the precise adjustment of the amplitudes and length of the radio-frequency pulses is thus explicitly readjusted again later, after the current component-dependent $B_1$ field maximum value is known. In this way, the RF pulses can be played out with the maximum possible amplitude with which the component protection conditions can still be maintained, and the pulses can be as short as possible (for a given sought magnetization strength) so that the bandwidth of the radio-frequency pulses is accordingly as high as possible, and consequently the chemical shift is less relevant. Significantly better magnetic resonance image data can thus hereby be generated in a very simple manner. A chemical shift is, as is known, the different spatial position of various chemical elements relative to one another, which is based on the different gyromagnetic ratios (and the magnetic resonance frequencies or, respectively, Larmor frequencies that are thereby shifted) of these materials. A typical example of this is water and fat, whose magnetic resonance frequencies are shifted by approximately 3 ppm counter to one another.

A suitable pulse optimization device for a magnetic resonance system that has a number of radio-frequency transmission channels must accordingly have the following components:

An input interface to transfer a number of RF pulse trains that respectively include a radio-frequency pulse and are designed so that a minimum $B_1$ field maximum value is not exceeded by the radio-frequency pulses. This means that the input interface must have access to RF pulse trains of such a design.

A maximum value determination unit that is designed in order to determine a current component-dependent $B_1$ field maximum value in an adjustment step specific to the examination subject.

A pulse adaptation unit which is designed in order to temporally shorten the radio-frequency pulses, wherein their amplitudes are increased under consideration of the current component-dependent $B_1$ field maximum value.

The RF pulse trains modified in this way, with the individual RF pulses with increased amplitude and correspondingly shortened duration, are then finally emitted via a suitable transmission unit in coordination, matched to the individual radio-frequency channels.

In addition to the multiple radio-frequency transmission channels as well as the additional typical system components (for example a gradient system, a basic field magnet etc.) and a control device that is designed to emit parallel RF pulse trains via the radio-frequency transmission channels to implement a desired measurement, a magnetic resonance system according to the invention also has a pulse optimization device according to the invention. The pulse optimization device can be part of the control device of the magnetic resonance system. In principle, however, the pulse optimization device can also be located in an external computer (connected with the control device via a network, for example), for example a user terminal or another computer to outsource computationally intensive processes.

Portions of the pulse optimization device—for example portions of the maximum value determination unit or the pulse adaptation unit—are preferably predominantly or wholly fashioned in the form of software. The invention thus also encompasses a non-transitory computer-readable data storage medium that can be loaded directly into a memory of a pulse optimization device and/or a control device, with program code segments in order to execute all steps of the method according to the invention when the program is executed in the pulse optimization device and/or a control device. Such a realization in software has the advantage that devices that are used in control devices of present magnetic resonance systems for the implementation of adjustment steps specific to the examination subject (for example for the determination of transmission scaling factors within the scope of a $B_1$ shimming) can be suitably modified (for example by implementation of the program) in order to implement the method according to the invention.

As mentioned above, the method can advantageously be used within the scope of a B1 shimming. For multiple radio-frequency transmission channels, a common "reference pulse train" is initially provided that defines a sequence of radio-frequency pulses to be emitted into the examination subject or, respectively, the region of interest. This reference pulse train includes at least one radio-frequency pulse (but most often, as explained multiple radio-frequency pulses). In an RF pulse optimization method, a complex transmission scaling factor is then determined for each of the radio-frequency transmission channels under consideration of a predetermined target magnetization in order to calculate the RF pulse trains for the transmission channels on the basis of the reference pulse train. The $B_1$ field at a location r, i.e. at a pixel or voxel position r (wherein r is a vector with the values of the Cartesian coordinates x, y, z in mm, for example),—is provided according to $$B_1(t) = \sum_{c=1}^{N} E_c(r) \cdot b_c(t) \qquad (2)$$

wherein $b_c(t)$ is an RF curve to be sent to the transmission channel $c=1, \ldots N$, i.e. the voltage amplitude curve (in V) of an RF pulse train over time t that is provided via $b_c(t)=SF_c \cdot b_R(t)$, wherein $SF_c$ is the complex scaling factor for the channel c and $b_R(t)$ is the voltage curve of the reference pulse train. $E_c(r)$ is the sensitivity (in μT/V) of the antenna element of the radio-frequency transmission channel c at a defined location r (i.e. the pixel or voxel position). $E_c(r)$ is the spatially dependent sensitivity distribution in the form of a sensitivity matrix. In the sense of the "$B_1$ shimming" it is typical to calculate the individual transmission scaling factors on the basis of a patient-specific adjustment so that a particularly homogenous excitation is to be achieved in comparison with the previous standard CP mode or even an "EP mode" (elliptically polarized mode).

Optimizers that minimize the magnitude deviation of the perfectly homogenous desired target magnetization m from the theoretically achieved real magnetization A·b are used to calculate the transmission scaling factors:

$$b = \arg_b \min(\|A \cdot b - m\|^2) \qquad (3)$$

wherein A is what is known as the design matrix, composed of a system of linear, complex equations into which enter the spatial transmission profiles of the individual transmission channels (antenna rods) and the present $B_0$ field distribution, among other things. For example, this design matrix can be as described in W. Grissom et al.: "Spatial Domain Method for the Design of RF Pulses in Multicoil Parallel Excitation", Mag. Res. Med. 56, 620-629, 2006. Here b is the vector of the parallel RF curves $b_c(t)$ to be emitted. If the solution of Equation (3)—i.e. the minimum of the "target function" defined in Equation (3)—is found, the desired scaling factors $SF_1, SF_2, \ldots, SF_N$ are present as a result.

Insofar as the invention is used within the scope of such a method, according to the invention the reference pulse train is initially predetermined according to the invention so that a minimum $B_1$ field maximum value (i.e. the "worst case $B_1$ field maximum value") is not exceeded by the radio-frequency pulses of the RF pulse trains of the individual transmission channels that are to be emitted later.

According to the invention, a current, component-dependent $B_1$ field maximum value is then moreover determined again on the basis of the RF pulse trains for the transmission channels in an examination subject-specific adjustment step. This preferably takes place automatically within the scope of the $B_1$ shimming, i.e. within the scope of the adjustment method, in which the complex scaling factors are also simultaneously determined.

If the current component-dependent $B_1$ field maximum value is known, the radio-frequency pulse in the reference pulse train is temporally shortened, wherein its amplitude is correspondingly scaled upward under consideration of the current component-dependent $B_1$ field maximum value. The determined transmission scaling factors are thereby not affected. Finally, the RF pulse trains for the transmission channels are then calculated on the basis of the modified reference pulse train (in which the radio-frequency pulses have been increased and temporally shortened) using the determined transmission scaling factors for the transmission channels. These RF pulse trains modified in such a manner are then emitted within the scope of the measurement (data acquisition procedure).

For this purpose, a corresponding pulse optimization device requires an input interface for the transfer of the reference pulse train. This means that the input interface must be coupled in some way with a suitable reference pulse generation unit. In addition, the pulse optimization device must be designed so that it also determines a scaling factor for each of the radio-frequency transmission channels under consideration of a predetermined target magnetization (which, for example, can be accepted via a corresponding interface) in order to then calculate the RF pulse trains for the transmission channels on the basis of the reference pulse train. For example, for this purpose the pulse optimization device can have a $B_1$ shimming unit. In this variant, the pulse adaptation unit is advantageously designed so that a radio-frequency pulse of the reference pulse train, or advantageously multiple or even all radio-frequency pulses of the reference pulse train (which is initially designed so that the minimum $B_1$ field maximum value is not exceeded by the radio-frequency pulses of the RF pulse trains of the individual transmission channels), is or are temporally shortened as described, and the amplitude is increased under consideration of the current component-dependent $B_1$ field maximum value. This means that a modified reference pulse train is initially generated by the pulse adaptation unit, and that then the RF pulse trains for the transmission channels are finally calculated on the basis of the modified reference pulse train, using the transmission scaling factors.

Within the scope of the method according to the invention, with the shortening of a radio-frequency pulse, it is preferably ensured that the echo time of a pulse sequence including the RF pulse train remains unchanged. It is preferably ensured that not only the echo time of the pulse sequence (which is particularly relevant to the image contrast) but also the entire remaining timing (i.e. the additional significant times, such as the pulse repetition times) also associated with this the energy calculation, as well as the total measurement duration, and under certain circumstances an associated breath-hold phase, remain unchanged.

If and when the radio-frequency pulse or pulses is/are slice-selective, a slice selection gradient pulse is typically emitted or switched in parallel with each radio-frequency pulse. This slice selection gradient pulse is then adapted with regard to its amplitude to the variation of the amplitude of the respective slice selection radio-frequency pulse, for example in that the amplitude is scaled in the same way. However, the time length of the slice selection gradient is thereby preferably kept constant, meaning that a shortening of the gradient duration or of the duration of the gradient pulse does not simultaneously involve the scaling of the amplitude (which is different than given the radio-frequency pulse itself).

The slice-selective radio-frequency pulses are preferably each emitted or in a centered manner relative to an associated slice selection gradient pulse. This has the advantage that the timing calculation is consistent since (for example) the echo time is always assumed from the middle of the pulse to the middle of the signal.

If an excitation pulse is a slice selection radio-frequency pulse, a dephasing pulse is normally associated with the associated slice selection gradient pulse. This serves to cancel the gradient moment exerted by the slice gradients on the nuclear spins (which gradient moment leads to an unwanted phasing) again after excitation of the nuclear spins. For this purpose, the dephasing pulse should have a gradient moment which is provided by the integral below the dephasing pulse, which corresponds to the inverse gradient moment of the slice gradient as of the excitation of the spins. This gradient moment is provided by the integral beneath the respective gradient pulse between the maximum of the RF pulse up to the end of the gradient pulse.

Given a variation of the amplitude of the slice selection gradient pulse, this dephasing pulse is adapted accordingly, i.e. advantageously is modified with regard to its amplitude but possibly also with regard to its time length. In this way, the gradient moment exerted by the excitation pulse on the nuclear spins after excitation of the nuclear spins is canceled, as desired, by the dephasing pulse.

The increase (according to the invention) of the amplitude of the radio-frequency pulses of the RF pulse trains or, respectively, of the radio-frequency pulse in the reference pulse train advantageously takes place under consideration of the relationship of the current component-dependent $B_1$ field maximum value to the minimum $B_1$ field maximum value (i.e. to the worst case B1 field maximum value). For example, an amplitude scaling factor can be determined from this relationship, which factor is then applied to the radio-frequency pulses. For example, the minimum $B_1$ field maximum value that was taken into account in the original design of the RF pulse train or of the reference pulse train could be only 6 μTesla. If, within the scope of the examination subject-specific adjustment step, it turns out that the current component-dependent $B_1$ field maximum value can realistically be applied at 9 μTesla under component protection conditions, the amplitude of the radio-frequency pulses can accordingly be respectively increased by a factor of 6:9 (=1.5). The duration of the RF pulses could accordingly be respectively shortened by a factor of 1.5, whereby a bandwidth increased by a factor of 1.5 is achieved. This leads to a significant reduction of artifacts due to the chemical shift.

As explained, the current component-dependent $B_1$ field maximum value serves to establish an amplitude limit below which the component protection is ensured.

In order to obtain a suitable current component-dependent $B_1$ field maximum value for this, this is advantageously calculated using at least one component protection model function. For a defined TX component in the radio-frequency transmission chain of a radio-frequency transmission channel of the magnetic resonance system, such a component protection model function represents a maximum allowable voltage there, wherein defined model assumptions are assumed. Possibilities for the definition of such component protection model functions are explained in further detail later using the exemplary embodiments. Using such component protection model functions, the matching $B_1$ field maximum value can be calculated (or at least estimated very well) for each magnetic resonance system individually, under consideration of the TX components used in the respective system and their circuitry.

The current component-dependent $B_1$ field maximum value is advantageously also calculated using spatially dependent sensitivity distributions $E_c(r)$ of the radio-frequency transmission channels, for example as already mentioned above in connection with Equation (2) and that describe the sensitivity of the respective antenna element associated with the appertaining radio-frequency transmission channel at location r.

Since the current component-dependent $B_1$ field maximum value can be adjusted depending on the location r, it is also possible that the current component-dependent $B_1$ field maximum value is advantageously calculated for a locally limited region. If the $B_1$ field maximum value is calculated only for a locally limited region, only an optimization can accordingly also take place under consideration of the respective local $B_1$ field within a defined region, for example only for the pixels or, respectively, voxels within a region of interest. In this way it is possible (under consideration of the RF exposure limits for the patient) to achieve a local increase of the $B_1$ field relative to the remaining regions in the examination subject.

The method according to the invention has been shown to have significant strengths even in the application to simple 2-channel systems in which, for example, a birdcage antenna is provided only with two feed points situated 90° from one another, as this is the case in many systems that are already present in clinics today. Via the slight modifications proposed according to the invention, significant improvements can thus also already be achieved in such systems. However, the number of transmission channels is not limited by the invention. The invention can also be used in connection with other antenna systems, for example local coil arrangements.

BRIEF DESCRIPTION OF THE DRAWINGS

FIG. 1 schematically illustrates an exemplary embodiment of a magnetic resonance system according to the invention.

FIG. 2 is used to explain $B_1$ shimming.

FIG. 3 is a flowchart of an exemplary embodiment of the method according to the invention.

FIG. 4 is a schematic representation of transmission components of an example of transmission chain of a magnetic resonance system.

FIG. 5 schematically shows the time curve of a slice-selective refocusing radio-frequency pulse (above) with an associated slice selection gradient pulse (below) before a shortening of the refocusing radio-frequency pulse according to the invention.

FIG. 6 shows the slice-selective refocusing radio-frequency pulse with the slice selection gradient pulse according to FIG. 5 after a shortening of the refocusing radio-frequency pulse according to the invention.

DESCRIPTION OF THE PREFERRED EMBODIMENTS

Figure 7:
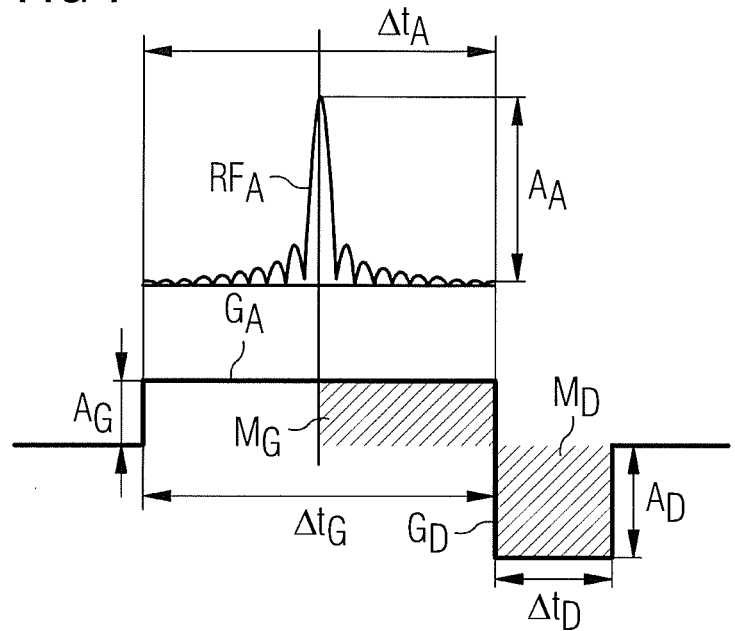
FIG. 7 schematically shows the time curve of a slice-selective refocusing radio-frequency pulse (above) with an associated slice selection gradient pulse (below) and a dephasing pulse before a shortening of the refocusing radio-frequency pulse according to the invention.

A magnetic resonance installation or magnetic resonance system 1 according to the invention is shown in a roughly schematic manner in FIG. 1. The system 1 includes the actual magnetic resonance scanner 2 with an examination space or patient tunnel 8 in the scanner 2. A bed 7 can be driven into the patient tunnel 8 so that, during an examination, a patient O or subject lying on the bed 7 can be supported at a specific position within the magnetic resonance scanner 2 relative to the magnet system and radio-frequency system arranged therein, or can be moved between different positions during a measurement.

Significant components of the magnetic resonance scanner 2 are a basic field magnet 3, a gradient system 4 with magnetic field gradient coils in order to apply magnetic field gradients in the x-, y- and z-directions, and a whole-body radio-frequency coil 5. The reception of magnetic resonance signals induced in the examination subject can take place via the whole-body coil 5 with which the radio-frequency signals are normally also emitted to induce the magnetic resonance signals. However, these signals are typically received with local coils 6 placed on or below the examination subject O. All of these components are known in principle to those skilled in the art, and therefore are only schematically shown in FIG. 1.

Here the whole-body radio-frequency coil 5 is designed as a birdcage antenna and has a number N of individual antenna rods that proceed parallel to the patient tunnel 8 and that are uniformly distributed on a periphery around the patient tunnel 8. At the ends, the individual antenna rods are respectively capacitively connected in the shape of a ring.

The antenna rods can be separately controlled by a control device 10 as individual transmission channels $S_1, \ldots, S_N$. The control device 10 can be a control computer that can be formed by a number of individual computers (possibly spatially separated and connected among one another via suitable cables or the like). Via a terminal interface 17, this control device 10 is connected with a terminal 24 via which an operator can control the entire system 1. In the present case, this terminal 24 as a computer is equipped with keyboard, one or more monitors and additional input devices (for example mouse or the like) so that the operator is provided with a graphical user interface.

Among other things, the control device 10 has a gradient control unit 11 that can in turn include multiple sub-components. The individual gradient coils are fed with control signals $SG_x$, $SG_y$, $SG_z$ via this gradient control unit 11. These control signals $SG_x$, $SG_y$, $SG_z$ are gradient pulses that are set at precisely provided time positions and with a precisely predetermined time curve during a measurement procedure.

Moreover, the control device 10 has a radio-frequency transmission/reception unit 12. This RF transmission/reception unit 12 likewise has multiple sub-components in order to respectively assign radio-frequency pulses separately and in parallel to the individual transmission channels $S_1, \ldots, S_N$, i.e. to the individually controllable antenna rods of the whole-body radio-frequency coil 5. Magnetic resonance signals can also be received via the transmission/reception unit 12. However, this typically occurs with the use of the local coils 6. The signals received with these local coils 6 are read out and processed by an RF reception unit 13. The magnetic resonance signals received by the RF reception unit 13 or by the whole-body coil by means of the RF transmission/reception unit 12 are passed as raw data RF to a reconstruction unit 14 that reconstructs the image data BD therefrom, and stores the image data BD in a memory 16 and/or passes the image data BD via the interface 17 to the terminal 24 so that the operator can view the image. The image data BD can also be stored and/or displayed and evaluated at other locations via a network NW.

The gradient control unit 11, the radio-frequency transmission/reception unit 12 and the reception unit 13 for the local coils 6 are respectively controlled in a coordinated manner by a sequence controller 15. Via corresponding commands, the sequence controller 15 ensures that a desired gradient pulse train GP is emitted via suitable gradient coil signals $SG_x$, $SG_y$, $SG_z$ and controls the RF transmission/reception unit 12 in parallel so that a multichannel pulse train b is emitted, meaning that the matching radio-frequency pulses are provided in parallel to the individual transmission rods of the whole-body coil 5. Moreover, it must be ensured that the magnetic resonance signals are read out at the matching point in time at the local coils 6 via the RF transmission/reception unit 13, or possibly signals are read out at the whole-body coil 5 via the RF transmission/reception unit 12 and are processed further. The sequence controller 15 provides the corresponding signals (in particular the multichannel pulse train b) to the radio-frequency transmission/reception unit 12 and the gradient pulse train GP to the gradient control unit 11, depending on a control sequence provided in a control protocol P. All control data that must be adjusted during a measurement are stored in this control protocol P.

A number of control protocols P for various measurements are typically stored in a memory 16. These could be selected by the user via the terminal 24 and varied as necessary in order to then provide a matching control protocol P for the current desired measurement with which the sequence controller 15 can operate. Moreover, the operator can also retrieve control protocols P via a network NW (for example from a manufacturer of the magnetic resonance system 1) and then modify and use these as necessary.

The basic workflow of such a magnetic resonance measurement and the cited components for control are known to those skilled in the art, and thus does not need to be described in more detail herein. Moreover, such a magnetic resonance scanner 2 as well as the associated control device 10 can include a number of further components that likewise do not need to be explained in detail herein.

At this point it is noted that the magnetic resonance scanner 2 can also be designed differently, for example with a laterally open patient space, and that in principle the antenna arrangement used for transmission does not need to be designed as a birdcage antenna. It is only necessary that it has multiple, separately controllable transmission channels $S_1, \ldots, S_N$, in the simplest case two transmission channels.

The measurement control unit 15 of the control device 10 has a reference pulse generation module 18 (for example in the form of a software module) that initially generates a reference pulse train $b_R$ according to the specifications in the control protocol P, which reference pulse train $b_R$ should be radiated in a suitable manner relative to the gradient pulses. This reference pulse train $b_R$ is initially passed via an input interface 20 of the pulse optimization device 19 to the pulse optimization device 19, which can likewise be designed as a software module within the measurement control unit 15. In this exemplary embodiment, this pulse optimization device 19 serves among other things to determine an individual, complex transmission scaling factor $SF_1, \ldots, SF_N$ for each of the radio-frequency transmission channels $S_1, \ldots, S_N$ in a $B_1$ shimming unit 21 in an RF pulse optimization method or $B_1$ shimming method.

Such a $B_1$ shimming method or RF pulse optimization method is schematically shown again in FIG. 2. As is apparent, the reference pulse train $b_R$ is passed to the pulse optimization device 19, which determines the complex transmission scaling factors $SF_1, SF_2, SF_3 \ldots, SF_N$. As schematically depicted, these are multiplied with the reference pulse train $b_R$ in order to obtain the individual pulse trains $b_1, b_2, b_3, \ldots, b_N$ which then together form the multichannel pulse train b that is emitted via the radio-frequency transmission/reception unit 12.

Alternatively, for example, the pulse optimization device 19 can be designed separate from the measurement control unit 15 or be part of the radio-frequency transmission/reception unit 12, such that the multiplication with the complex transmission scaling factors $SF_1, SF_2, SF_3 \ldots, SF_N$ (for example) takes place in hardware. The reference pulse generation module 18 can likewise also be a separate device or, for example, part of the radio-frequency transmission/reception unit 12. Such a $B_1$ shimming method and the devices required for this are, however, known to the man skilled in the art from basic principles.

As mentioned above, however, the method is not limited to use within the scope of a $B_1$ shimming; rather, it is in principle possible to use this method when pTX pulse series are generated in which pulse trains for the individual radio-frequency signals are individually provided in order to generate a defined excitation pattern. In this case, the input interface 20 of the pulse optimization device 19 is designed (for example) to accept corresponding pTX pulse series, for example complete pulse sequences with multiple corresponding, individually designed RF pulse trains. Furthermore, for example, the reference pulse generation module 18 is then designed accordingly so that not only a reference pulse train but accordingly individually designed RF pulse trains are created with this for the individual channels. In this case, a $B_1$ shimming unit is possibly not required in the pulse optimization device 19.

Moreover, here a current component-dependent $B_1$ field maximum value is determined in the pulse optimization device 19 in the manner according to the invention within the scope of the examination subject-specific adjustment step. A maximum value determination unit 22 serves for this. Insofar as a $B_1$ shimming is implemented, for example, this determination of the $B_1$ field maximum value can also take place within the scope of this $B_1$ shimming, wherein then the maximum value determination unit 22 can be part of the $B_1$ shimming unit 21, for example.

In a pulse adaptation unit 23 of the pulse optimization device 19, the radio-frequency pulses in the individual RF pulse trains (or in a method in which a reference pulse train is provided and the RF pulse trains for the individual channels are first generated in a $B_1$ shimming method, the frequency pulses of this reference pulse train) are then temporally shortened according to the invention and suitably scaled in terms of their level under consideration of the determined $B_1$ field maximum value.

In a $B_1$ shimming method, this pulse adaptation unit 23 then also calculates the modified RF pulse trains $b_1, \ldots b_N$ for the individual transmission channels $S_1, \ldots, S_N$ from the modified reference pulse train $b_R$ with the use of the previously determined transmission scaling factors $SF_1, \ldots, SF_N$.

The $B_1$ shimming unit 21, the maximum value determination unit 22 and the pulse adaptation unit 23 are preferably designed as software modules that here are part of the pulse optimization device 19, for example. In principle, however, all of these units can be designed as individual units networked among on another in another manner.

The method according to the invention is now explained again using FIG. 3, wherein here it is assumed that the method is generated within the scope of a $B_1$ shimming. If the same individual RF pulse trains are determined for the individual transmission channels instead of a reference pulse train and subsequent determination of the transmission scaling factors, the method according to the invention is implemented in an analogous manner.

The method according to FIG. 3 initially begins in Step I with a reference pulse train $b_R$ being determined. This can take place in a typical optimization method, as such RF pulse trains or, respectively, complete pulse sequences have also previously been determined. A wide variety of optimization methods are known to those skilled in the art for this purpose.

In Step II, a complex transmission scaling factor $SF_1, \ldots, SF_N$ is then determined under specification of a target magnetization m for this reference pulse train $b_R$ for the individual transmission channels $S_1, \ldots, S_N$. For example, this can take place according to the method described in connection with Equation (3). Only a suitable target function and possibly defined boundary conditions must be established so that the solutions are calculated by a typical calculation program (known as a "solver", for example the solver fmincon by The Mathworks Inc.). However, other arbitrary, previously known optimization methods as well as combinations of various optimization methods can also be used for this. Moreover, in Step II a current component-dependent $B_1$ field maximum value ($<B_1>_{max}$) is determined in Step II with the transmission scaling factors.

The $B_1$ field maximum value ($<B_1>_{max}$) can thereby be determined according to the following equation, for example:

$$\langle B_1 \rangle_{max} = \left\{ \sum_{c=1}^{N} E_c(r) \cdot (\min\{U_{max}^1, U_{max}^2, U_{max}^3, \ldots\} \cdot SF_c) \right\} \quad (4)$$

wherein $E_c(r)$ is again the sensitivity matrix (in µTesla/volt) and $SF_c$ is the scaling factor of the transmission channel $c=1, \ldots, N$, and r is the spatial pixel or, respectively, voxel position (in mm), as has already been explained above in connection with Equation (2). The functions $U_{max}^i$, $i=1, 2, 3, \ldots$, are component protection model functions which represent the respective maximum allowable voltage (in volts) at a specific transmission component in the transmission chain of the magnetic resonance system 1.

Reference is made to FIG. 4 to explain this approach. FIG. 4 shows a simplified block flow chart of an example of a transmission chain of a magnetic resonance system. In a first transmission component 31 (shown as a block), which also should comprise the reference pulse generation unit 18 and the RF pulse optimization unit 19, as explained using FIG. 2 a multichannel pulse train b is generated with multiple individual RF pulse trains $b_1, b_2, b_3, \ldots, b_N$, and in fact here with a reduced voltage. These RF pulse trains $b_1, b_2, b_3, \ldots, b_N$ are then passed to an amplifier component 32 with N different amplifier channels, corresponding to the number N of transmission channels. After this the amplified radio-frequency pulses are fed via a cable arrangement 33 and via an adaptation network 34 into the radio-frequency antenna 5, for example the individual antenna elements of the birdcage 5. Defined limits with regard to the maximum allowable voltage pulses on the individual channels (which are represented by the component protection model functions in Equation (4)) apply to all of these transmission components 32, 33, 34, i.e. both to the individual amplifier channels of the amplifier component 32 and to the cables of the cable arrangement 33 and to the channels in the adaptation network 34. These component protection model functions can in turn be dependent on the scaling factors, meaning that:

$$U_{max}^1 = f(SF) \quad (5)$$

wherein SF is again the vector of the transmission scaling factors $SF_c$. f is a function that describes the dependency. This dependency is provided (among other things) because the transmission scaling factors $SF_c$ are complex factors that modify not only the amplitudes relative to one another but also the phases. For example, the phase shift can directly lead to the situation that a significantly higher voltage is present between two adjacent transmission channels within one of the TX components 32, 33, 34 of the transmission chain than the maximum voltage that is emitted at the individual transmission channels.

The component protection model function $U_{max}^i$, $i=1, 2, 3, \ldots$, can be determined in various ways. In a particularly simple variant, $U_{max}^i$ can be determined as follows for the i-th component:

$$U_{max}^i = \frac{\max_c(|b_c|)}{d^i} \cdot \text{limit}^i \quad (6)$$

wherein $b_c$ is herein the voltage amplitude at the channel $c=1, \ldots, N$ (N=number of channels) at any arbitrary point in time n ($b_c = SF_c \cdot b_R$, and $b_R$ is the voltage amplitude of the reference pulse train at any arbitrary point in time n).

The numerator $\max_c(|b_c|)$ is the maximum value of all voltage amplitudes at the channels c, i.e. the voltage maximum over all channels, at any arbitrary point in time n.

The denominator $d^i$ is hereby a limiting vector (subconstraint vector) with K vector elements $d_k^i$, $k=1, \ldots, K$. The number K depends on the hardware modeling that is used, and can have a value of 1 or a value corresponding to the number of channels (i.e. K=N). These vector elements $d_k^i$ can be defined as follows:

$$d_k^i = L^i \cdot M^i \cdot \begin{pmatrix} 0 \\ b_c \end{pmatrix} \quad (7)$$

wherein $L^i$ is thereby the combination matrix of the respective component i and has a value of K×2N. For the case where N=2 (i.e. for a system with two channels) and K=N, $L^i$ can be viewed as follows, for example:

$$L^i = \begin{pmatrix} 1 & 0 & 1 & 0 \\ 0 & 1 & 0 & 1 \end{pmatrix} \quad (8)$$

The factor $M^i$ is what is known as the wave chain matrix that describes the hardware component i. Its value is 2N×2N, wherein N is again the number of channels.

The vector to the far right side in Equation (7) has a value of 0 as the upper N entries, and under this a vector portion that comprises N values $b_c$ as they have been explained above with regard to Equation (6). The 0-vector represents the returning wave (at the input of the RF transmission chain), and the known partial vector $b_c$ represents the forward wave.

For the limits that are to be complied with:

$$|d^i| < \text{limit}^i \quad (9)$$

wherein the value limit$^i$ is, for example, respectively established by the maximum allowable voltage or another suitable value (for example the maximum allowable magnetic field) of the respective hardware component i. In this simple case, the absolute value should thus respectively be limited to the sum of the forward and returning wave, individual to the channel.

As Equation (4) shows, the $B_1$ field maximum value $<B_1>_{max}$ is also dependent on the location r. This means that only a local optimization for specific pixels or voxels can accordingly be implemented within the entire examined region. For example, for this a region of interest ROI can initially be entered as an input. For example, this can be made by an operator with the use of a graphical user interface that allows the corresponding region ROI to be drawn in an image from a preliminary measurement. Such a region of interest ROI can also be established with automatic methods.

Reference is also made to DE 10 2012 207 132 (the content of which is incorporated herein by reference) for the determination of $B_1$ field maximum values $<B_1>_{max}$ on the basis of component protection model functions. However, other methods to determine $B_1$ field maximum values (in particular due to component protection) are likewise possible within the scope of the invention.

Finally, according to the invention in Step III the amplitude of the radio-frequency pulses in the reference pulse train $b_R$ are respectively increased under consideration of the current component-dependent $B_1$ field maximum value $<B_1>_{max}$ and the radio-frequency pulses are suitably temporally shortened so that a modified reference pulse train $b'_R$ is generated in this way. This is explained again in an example using FIGS. 5 and 6 for a slice-selective refocusing pulse $RF_R$ as well as using FIGS. 7 and 8 for a slice-selective excitation pulse $RF_A$ within a spin echo sequence.

FIGS. 5 and 6 show a refocusing pulse $RF_R$, $RF'_R$ which should refocus a volume in a defined slice which lies orthogonal to the z-direction. A gradient pulse $G_R$, $G'_R$ is accordingly emitted in the z-direction in parallel with the refocusing pulse $RF_R$, $RF'_R$.

FIG. 5 shows the radio-frequency pulse $RF_R$ together with the associated gradient pulse $G_R$ before the modification according to the invention. Here it is ensured that the maximum amplitude $A_R$ of the refocusing pulse $RF_R$ is so large that, even in the most disadvantageous case, a minimum $B_1$ field maximum value is not exceeded later by the emitted RF pulse trains. The duration $\Delta t_R$ is accordingly selected to be so long that, in spite of the reduced voltage amplitude $A_R$, sufficient radio-frequency power is radiated in order to achieve a predetermined flip angle in the slice volume to be refocused. The length $\Delta t_G$ of the gradient pulse $G_R$ is selected corresponding to the length $\Delta t_A$ of the refocusing pulse $RF_R$. The amplitude $A_G$ of the slice selection gradient pulse $G_R$ is also adapted accordingly.

As is apparent from FIG. 6, in Step II the refocusing pulse was then accordingly increased in its amplitude as far as possible under consideration of the new current component-dependent $B_1$ field maximum value $<B_1>_{max}$, which is greater than the minimum $B_1$ field maximum value. The modified refocusing pulse $RF'_R$ thus now has a greater amplitude $A'_R$. Since achieving a defined flip angle depends only on the integral under the pulse, the duration $\Delta t'_R$ of the refocusing pulse $RF'_R$ could be shortened accordingly. The bandwidth of the refocusing pulse $RF'_R$ is thus also greater after modification than before modification. In the shortening of the refocusing pulse $RF'_R$, however, care was taken to leave the timing of the complete pulse sequence otherwise unmodified, and in particular to not alter the echo time. The time length $\Delta t_G$ of the emitted, parallel slice selection gradient pulse $G'_R$ was also accordingly left unchanged. Only the amplitude $A'_G$ of the refocusing pulse $G'_R$ was correspondingly scaled with the same factor as the amplitude $A'_R$ of the refocusing pulse $RF'_R$. It is thereby ensured that the same slice width is excited again.

However, by increasing the bandwidth of the refocusing pulse it is now achieved that the chemical shift that is proportional to the bandwidth of the emitted radio-frequency pulse is reduced relative to the unmodified refocusing pulse, which leads to significant improvements with regard to artifacts due to this.

Figure 8:
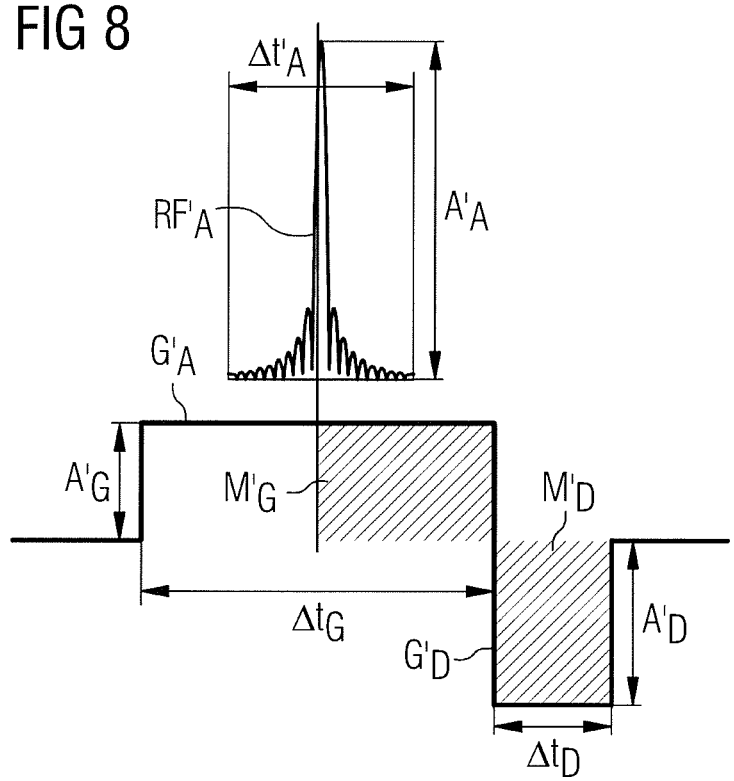
FIG. 8 shows the slice-selective excitation radio-frequency pulse with the slice selection gradient pulse and the dephasing pulse according to FIG. 7 after a shortening of the excitation radio-frequency pulse according to the invention.

As already mentioned, FIGS. 7 and 8 show an analogous case for the modification of a slice-selective excitation pulse $RF_A$ which serves for the first excitation of a specific, defined slice. This pulse $RF_A$ also has a defined time length $\Delta t_A$ before the modification according to the invention and a defined amplitude $A_A$, wherein the amplitude $A_A$ is selected again so that the worst case condition with regard to the component protection is complied with, meaning that a minimum $B_1$ field maximum value is in no case exceeded in the later emission of the pulse trains on the basis of this reference pulse train. Here again, a slice selection gradient pulse $G_R$ that has a suitable amplitude $A_G$ is played out parallel to this excitation radio-frequency pulse $RF_A$. This slice selection gradient pulse $G_R$ again here initially has a time length $\Delta T_G$ that corresponds to the time length $\Delta t_A$ of the excitation radio-frequency pulse $RF_A$.

In contrast to the case of the refocusing pulse $RF_R$ according to FIGS. 5 and 6, however, here a dephasing pulse $G_D$ with a time length $\Delta t_D$ and an amplitude $A_D$ follows the slice selection gradient pulse $G_A$. The amplitude $A_D$ and the time length $\Delta t_D$ of the dephasing pulse $G_D$ are selected so that the integral under the dephasing pulse $G_D$—what is known as the "first moment" or "gradient moment" $M_D$ of the dephasing pulse $G_D$—corresponds to the negative gradient moment $M_G$ in the second half of the slice selection gradient pulse $G_A$, and phasing effects due to this in the excited slice are eliminated again.

As is apparent from FIG. 8, given such an excitation radio-frequency pulse $RF_A$ in the method according to the invention it is also ensured that a modified excitation radio-frequency pulse $RF'_A$ is generated that has a higher amplitude $A'_A$ than before the modification, and accordingly the time duration $\Delta t_A$ is shortened so that the modified pulse $RF'_A$ generates the same flip angle as the unmodified excitation radio-frequency pulse $RF_A$. The amplitude $A'_G$ of the associated modified slice selection gradient pulse $G'_A$, whose time length $\Delta t_G$ was left unchanged again, was also adapted accordingly in order to not alter the timing of the sequence. However, here the amplitude $A'_D$ of the dephasing pulse $G'_D$ was also modified to the same extent so that, as before, it is ensured that the gradient moment $G'_D$ of the dephasing pulse $G'_D$ cancels the gradient moment $M'_G$ in the second part of the modified slice selection gradient pulse $G'_A$ again. For such an excitation radio-frequency pulse, the bandwidth can thus also be increased very simply in the manner according to the invention, and artifacts due to a chemical shift can thus be reduced.

As is apparent from FIG. 3, a modified reference pulse train $b'_R$ is generated via the modification of the individual radio-frequency pulses $RF_A$ and $RF_R$. In Step IV, the complex scaling factors $SF_1, \ldots, SF_N$ that were determined in Step II can then be used in order to determine RF pulse trains for the individual transmission channels via scaling of the reference pulse train $b'_R$, as this was already explained in connection with FIG. 2.

The result is thus a set of RF pulse trains $b_1, \ldots, b_N$ that can be emitted via the different channels $1, \ldots, N$ in order to implement the desired measurement, wherein unwanted effects due to the chemical shift can now be reduced, however.

By virtue of the dynamic design of the pulse duration of the radio-frequency pulses given simultaneously fixed timing with regard to the gradient pulses, it is ensured that the effective timing of the entire pulse sequence no longer needs to be altered after the first generation, and corresponding settings (such as the contrast-determining echo time) remain unchanged. This makes the method particularly simple in practical application.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance system having a scanner comprising multiple radio-frequency (RF) transmission channels, said method comprising:
   via the multiple radio-frequency transmission channels, emitting respective RF pulse trains in parallel, each RF pulse train comprising at least one RF pulse that produces a B1 field;
   in a processor, initially determining said RF pulse trains so that the at least one RF pulse in each of the respective RF pulse trains does not exceed a minimum B1 field maximum value;
   with an examination subject located in the magnetic resonance scanner, operating the magnetic resonance scanner to determine a hardware component-dependent B1 field maximum value that is dependent on hardware components of the scanner;
   in said processor, temporally shortening the respective at least one RF pulse in each of the RF pulse trains by increasing an amplitude of said at least one RF pulse dependent on said hardware component-dependent B1 field maximum value; and
   from said processor, emitting control signals to operate the scanner to acquire diagnostic magnetic resonance data from the examination subject by emitting the respective RF pulse trains in parallel, each with the increased amplitude of the at least one RF pulse therein.

2. A method as claimed in claim 1, comprising:
   in said processor, initially predetermining a common reference pulse train for said multiple RF transmission channels, said common reference pulse train comprising at least one RF pulse;
   in said processor, executing an optimization algorithm to determine a respective transmission scaling factor for each of said RF transmission channels dependent on a predetermined target magnetization in said subject, and calculating the respective RF pulse trains for the respective transmission channels dependent on said target magnetization and said reference pulse train;
   in said processor, predetermining said reference pulse train to cause said minimum B1 field maximum value not to be exceeded by the respective at least one RF pulse of the respective RF pulse trains;
   determining said hardware component-dependent B1 field maximum value based on the RF pulse trains for the respective transmission channels;
   shortening the at least one RF pulse in the reference pulse train to cause an amplitude thereof to be increased dependent on said hardware component-dependent B1 field maximum values, thereby obtaining a modified reference pulse train; and
   in said processor, calculating the respective RF pulse trains for the respective transmission channels using the modified reference pulse train and the transmission scaling factors.

3. A method as claimed in claim 2 comprising maintaining said reference pulse train unchanged when shortening said at least one RF pulse in the respective RF pulse trains.

4. A method as claimed in claim 2 comprising emitting said at least one RF pulse in said reference pulse train as a slice-selective RF pulse, and emitting a slice selection gradient pulse in parallel with said slice-selective RF pulse, and adapting an amplitude of said slice selection gradient pulse to an amplitude of said slice-selective RF pulse while maintaining a time duration of said slice selection gradient pulse constant.

5. A method as claimed in claim 4 comprising emitting said slice-selective RF pulse centrally, with respect to time, relative to the slice selection gradient pulse emitted in parallel therewith.

6. A method as claimed in claim 4 comprising emitting said slice-selective RF pulse as an excitation pulse, and emitting at least one dephasing pulse and adapting said at least one dephasing pulse dependent on a change in the amplitude of the slice selection gradient pulse emitted in parallel therewith.

7. A method as claimed in claim 4 comprising increasing the amplitude of the slice-selective RF pulse dependent on a relationship between said hardware component-dependent B1 field maximum value and said minimum B1 field maximum value.

8. A method as claimed in claim 1 comprising emitting said at least one RF pulse in each of said pulse trains as a slice-selective RF pulse, and emitting a slice selection gradient pulse in parallel with said slice-selective RF pulse, and adapting an amplitude of said slice selection gradient pulse to an amplitude of said slice-selective RF pulse while maintaining a time duration of said slice selection gradient pulse constant.

9. A method as claimed in claim 8 comprising emitting said slice-selective RF pulse centrally, with respect to time, relative to the slice selection gradient pulse emitted in parallel therewith.

10. A method as claimed in claim 8 comprising emitting said slice-selective RF pulse as an excitation pulse, and emitting at least one dephasing pulse and adapting said at least one dephasing pulse dependent on a change in the amplitude of the slice selection gradient pulse emitted in parallel therewith.

11. A method as claimed in claim 8 comprising increasing the amplitude of the slice-selective RF pulse dependent on a relationship between said hardware component-dependent B1 field maximum value and said minimum B1 field maximum value.

12. A method as claimed in claim 1 comprising emitting each RF pulse train as a part of a pulse sequence comprising an echo time, and maintaining said echo time unchanged when shortening said at least one RF pulse in each of said RF pulse trains.

13. A method as claimed in claim 1 comprising, in said processor, calculating said B1 field maximum value using at least one component protection model function that represents a maximum allowable voltage for a transmission component of said magnetic resonance system.

14. A method as claimed in claim 1 comprising, in said processor, calculating said B1 field maximum value using spatially dependent sensitivity distributions of said multiple RF transmission channels.

15. A method as claimed in claim 1 comprising, in said processor, calculating said B1 field maximum value only for a locally limited region in said magnetic resonance system.

16. A pulse optimization device for operating a magnetic resonance system having a scanner comprising multiple radio-frequency (RF) transmission channels, said method comprising:
an input interface configured to receive, for each of the multiple radio-frequency transmission channels, a respective RF pulse train, each RF pulse train comprising at least one RF pulse that produces a B1 field in said magnetic resonance scanner, wherein the at least one RF pulse in each of the respective RF pulse trains does not exceed a minimum B1 field maximum value;
a maximum value determination unit provided with data obtained by operating the magnetic resonance scanner with an examination subject located in the scanner, and configured to determine a hardware component-dependent B1 field maximum value that is dependent on hardware components of the scanner;
a pulse adaptation unit configured to temporally shorten the respective at least one RF pulse in each of the RF pulse trains by increasing an amplitude of said at least one RF pulse dependent on said hardware component-dependent B1 field maximum value: and
from said processor, emitting control signals to operate the scanner to acquire diagnostic magnetic resonance data from the examination subject by emitting the respective RF pulse trains in parallel, each with the increased amplitude of the at least one RF pulse therein.

17. A pulse optimization device as claimed in claim 16, comprising:
said input interface being configured to receive a common reference pulse train for said multiple RF transmission channels, said common reference pulse train comprising at least one RF pulse;
a processor configured to execute an optimization algorithm to determine a respective transmission scaling factor for each of said RF transmission channels dependent on a predetermined target magnetization in said subject, and calculating the respective RF pulse trains for the respective transmission channels dependent on said target magnetization and said reference pulse train;
said processor being configured to predetermine said reference pulse train to cause said minimum B1 field maximum value not to be exceeded by the respective at least one RF pulse of the respective RF pulse trains;
said processor being configured to determine said hardware component-dependent B1 field maximum value based on the RF pulse trains for the respective transmission channels;
said processor being configured to shorten the at least one RF pulse in the reference pulse train to cause an amplitude thereof to be increased dependent on said hardware component-dependent B1 field maximum values, thereby obtaining a modified reference pulse train; and
said processor being configured to calculate the respective RF pulse trains for the respective transmission channels using the modified reference pulse train and the transmission scaling factors.

18. A magnetic resonance system comprising:
a magnetic resonance data acquisition scanner comprising multiple radio-frequency (RF) transmission channels;
a control unit configured to operate said data acquisition scanner to emit, via the multiple radio-frequency transmission channels, respective RF pulse trains in parallel, each RF pulse train comprising at least one RF pulse that produces a B1 field;
a processor configured to initially determine said RF pulse trains so that the at least one RF pulse in each of the respective RF pulse trains does not exceed a minimum B1 field maximum value;
said control unit being configured to operate said data acquisition scanner with an examination subject located therein to obtain a hardware component-dependent B1 field maximum value that is dependent on hardware components of the scanner;
said processor being configured to temporally shorten the respective at least one RF pulse in each of the RF pulse trains by increasing an amplitude of said at least one RF pulse dependent on said hardware component-dependent B1 field maximum value; and
from said processor, emitting control signals to operate the scanner to acquire diagnostic magnetic resonance data from the examination subject by emitting the respective RF pulse trains in parallel, each with the increased amplitude of the at least one RF pulse therein.

19. A non-transitory, computer-readable data storage medium encoded with programming instructions, said storage medium being loaded into a computerized control unit of a magnetic resonance system, said magnetic resonance system comprising a scanner having multiple radio-frequency (RF) transmission channels, and said programming instructions causing said control unit to:
operate the scanner to emit, via the multiple radio-frequency transmission channels, respective RF pulse trains in parallel, each RF pulse train comprising at least one RF pulse that produces a B1 field;
initially determine said RF pulse trains so that the at least one RF pulse in each of the respective RF pulse trains does not exceed a minimum B1 field maximum value;
with an examination subject located in the scanner operate the scanner to determine a hardware component-dependent B1 field maximum value that is dependent on hardware components of the scanner;
temporally shorten a respective at least one RF pulse in each of the RF pulse trains by increasing an amplitude of said at least one RF pulse dependent on said hardware component-dependent B1 field maximum value; and
from said processor, emitting control signals to operate the scanner to acquire diagnostic magnetic resonance data from the examination subject by emitting the respective RF pulse trains in parallel, each with the increased amplitude of the at least one RF pulse therein.

20. A method as claimed in claim 1 wherein said at least one RF pulse in the reference pulse train has a flip angle prior to shortening said at least one RF pulse in the reference pulse train, and comprising shortening said at least one RF pulse in the reference pulse train to cause said RF pulse in the reference pulse train with the amplitude thereof increased to have the same flip angle as said at least one RF pulse in the reference pulse train prior to shortening thereof.

* * * * *